United States Patent [19]

Chave

[11] Patent Number: 5,040,050
[45] Date of Patent: Aug. 13, 1991

[54] HYBRID CIRCUIT COMPRISING A CASCADE CONNECTION OF PARALLEL-TRANSISTOR STAGES

[75] Inventor: Jacques Chave, Lyon, France
[73] Assignee: GEC Alsthom SA, Paris, France
[21] Appl. No.: 596,125
[22] Filed: Oct. 11, 1990

[30] Foreign Application Priority Data

Oct. 11, 1989 [FR] France ............... 89 13277

[51] Int. Cl.⁵ ............ H01L 23/48; H01L 27/10
[52] U.S. Cl. ........................... 357/68; 357/45
[58] Field of Search ..................... 357/68, 45

[56] References Cited

U.S. PATENT DOCUMENTS

Re. 27,730  8/1973  Goordman et al. ............. 330/15
4,907,068   3/1990  Amann et al. ................. 357/74

FOREIGN PATENT DOCUMENTS 0265833  5/1988  European Pat. Off.
0277546  8/1988  European Pat. Off.
2620862  3/1989  France.
2135824  9/1984  United Kingdom.

*Primary Examiner*—Mark Prenty
*Attorney, Agent, or Firm*—Sughrue, Mion, Zinn Macpeak & Seas

[57] ABSTRACT

This circuit is such that the semiconductor chips constituting the various transistors of the circuit are organized in a matrix in which the various columns are formed on a first network of conductor tracks and are separated by second and third networks of conductor tracks, said networks being connected to respective different connection tabs of the semiconductor chips.

4 Claims, 1 Drawing Sheet

HYBRID CIRCUIT COMPRISING A CASCADE CONNECTION OF PARALLEL-TRANSISTOR STAGES

The present invention relates to a hybrid circuit comprising a cascade connection of parallel-transistor stages.

BACKGROUND OF THE INVENTION

A hybrid circuit is an assembly of electronic components on a "substrate" having a network of conductor tracks printed thereon and terminating at connection tabs for said components. Connections are made to active components by means of very fine bonding wires interconnecting connection tabs on the semiconductor chips constituting said active components and corresponding connection tabs on the hybrid circuit substrate.

For a given circuit, there generally exists a wide variety of possible layouts for these items.

The object of the present invention is to provide a particular layout enabling stages of parallel-connected transistors to be connected in cascade, thereby producing "Darlington" type circuits or "MOS-BIP" type circuits (comprising MOS type transistors in association with bipolar type transistors), which circuits are used, in particular, in power electronics or in energy conversion systems.

More particularly, the layout of the invention makes it possible to obtain a better current balance between the output of a control stage and the input of a controlled stage, thereby optimizing the operation of the circuit and reducing the risks of damaging the electronic components constituting the circuit.

SUMMARY OF THE INVENTION

The present invention provides a hybrid circuit comprising a cascade connection of parallel-transistor stages, the circuit comprising a control stage and having "n" transistors and a controlled stage having "m.n" transistors, these various transistors being in the form of respective semiconductor chips each provided with connection tabs of a first type located on their faces facing the substrate of the hybrid circuit and connection tabs of a second type and of a third type located on another face, said substrates having conductor tracks of a first type placed in contact with the connection tabs of the first type, and conductor tracks of a second type and of a third type connected to the connection tabs of the second and third types via conductor wires, said circuit being such that the connection tabs of the first type of the transistors in the control stage are connected to the connection tabs of the first type of the transistors in the controlled stage, the connection tabs of the second type of the transistors in the control stage and constituting the output of the control stage are connected to the connection tabs of the second type of the transistors of the controlled stage, constituting the input of the controlled stage, and the connection tabs of the third type of the transistors in the control stage are interconnected, as are the connection tabs of the third type of the transistors in the controlled stage, wherein said semiconductor chips are disposed in a matrix of "n" columns by "m+1" rows, there being one control stage transistor per column for "m" controlled stage transistors, the various columns being formed on different conductor tracks of the first type interconnected in accordance with the above-defined layout and being separated alternately by the conductor tracks of the second type and of the third type, which tracks are interconnected in accordance with the above-defined layout.

BRIEF DESCRIPTION OF THE DRAWING

An embodiment of the invention is described by way of example with reference to the accompanying drawing, in which.

DETAILED DESCRIPTION

Figure 1:
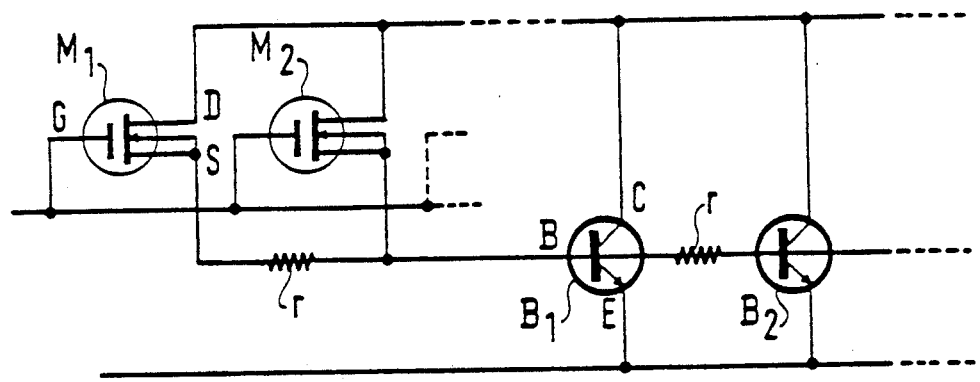
FIG. 1 is an electrical circuit diagram of a "MOS-BIP" circuit.

The "MOS-BIP" circuit shown in FIG. 1 is a cascade connection of two stages each comprising transistors connected in parallel, namely a control stage constituted by "n" MOS transistors $M_1$, $M_2$, ..., etc. connected in parallel, and a controlled stage constituted by "m.n" bipolar transistors $B_1$, $B_2$, ..., etc. connected in parallel.

The output from the control stage, constituted by the interconnected sources S of the various MOS transistors is connected to the input of the controlled stage constituted by the interconnected bases B of the various bipolar transistors.

The gates G of the MOS transistors are also interconnected as are the emitters of the bipolar transistors, with the interconnected drains D of the MOS transistors being connected to the interconnected collectors C of the bipolar transistors.

To implement this circuit using hybrid circuit technology, the transistors are in the form of rectangular semiconductor chips provided with connection tabs corresponding to the various electrodes of the transistors disposed on the back and front faces of the chips, which faces are constituted respectively by the face placed against the hybrid circuit substrate and the face looking away therefrom.

For a MOS transistor, the drain access tab is placed on the rear face, and the gate and source access tabs are placed on the front face. For a bipolar transistor, the collector access tab is placed on the rear face, and the base and emitter access tabs are placed on the front face.

Figure 2:
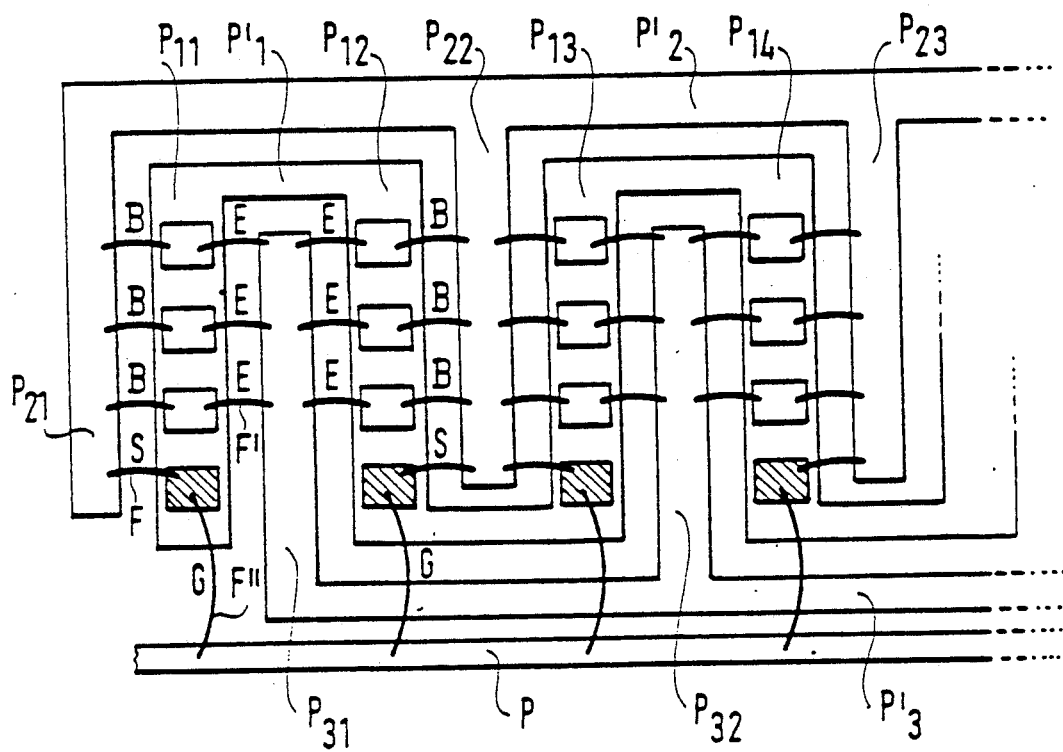
FIG. 2 is a layout diagram in accordance with the invention of a hybrid circuit implementation of the "MOS-BIP" circuit shown in FIG. 1.

In the layout shown in FIG. 2, these semiconductor chips are organized in a matrix of "n" columns by "m+1" rows, with each column having one MOS transistor and three bipolar transistors (i.e. FIG. 2 shows an example where m=3), with the MOS transistors being distinguished in the figure by their front faces being shaded, while the front faces of the bipolar transistors are not shaded.

The drains of the MOS transistors in the various columns are connected to the collectors of the bipolar transistors by said transistors being mounted on various conductor tracks $P_{11}$, $P_{12}$, ..., etc. which are interconnected by transverse conductor tracks such as $P'_1$.

The various columns of transistors disposed in this way on the conductor tracks $P_{11}$, $P_{12}$, ..., etc., are separated alternately by second conductor tracks $P_{21}$, $P_{22}$, $P_{23}$, ..., and third conductor tracks $P_{31}$, $P_{32}$, ..., thereby respectively enabling the bases of the bipolar transistors in a column to be connected to the source of the MOS transistor in the column via conductor wires such as F, and enabling the emitters of the bipolar transistors of a column to be interconnected, likewise via conductor wires such as F'.

The second conductor tracks $P_{21}, P_{22}, P_{23}, \ldots,$ are interconnected by transverse conductor tracks such as $P'_2$, while the third conductor tracks $P_{31}, P_{32}, \ldots,$ are interconnected by transverse conductor tracks such as $P'_3$.

To improve the compactness of the layout, the transverse conductor tracks such as $P'_1$, $P'_2$, and $P'_3$ are advantageously disposed on either side of the pattern obtained in this way.

The gates of the various MOS transistors are also interconnected by means of conductor wires such as F" all connected to a common conductor track P, which is advantageously disposed transversely.

In order to balance the flow of current between the sources of the MOS transistors and the bases of the bipolar transistors, the conductor wires bearing references F, F', and F" are of equal length and as short as possible. This minimizes connection resistances (referenced "r" in FIG. 1) between the MOS transistors and the bipolar transistors and also serves to reduce current loops and thus reduce stray inductance.

I claim:

1. A hybrid circuit comprising a cascade connection of parallel-transistor stages, the circuit comprising a control stage having "n" transistors and a controlled stage having "m×n" transistors, these various transistors being in the form of respective semiconductor chips each provided with connection tabs of a first type located on a face facing a substrate of the hybrid circuit and connection tabs of a second type and of a third type located on another face, said substrates having conductor tracks of a first type placed in contact with the connection tabs of the first type, and conductor tracks of a second type and of a third type connected to the connection tabs of the second and third types via conductor wires, said circuit being such that the connection tabs of the first type of the transistors in the control stage are connected to the connection tabs of the first type of the transistors in the controlled stage, the connection tabs of the second type of the transistors in the control stage and constituting the output of the control stage are connected to the connection tabs of the second type of the transistors of the controlled stage, constituting the input of the controlled stage, and the connection tabs of the third type of the transistors in the control stage are interconnected, as are the connection tabs of the third type of the transistors in the controlled stage, wherein said semiconductor chips are disposed in a matrix of "n" columns by "m+1" rows, there being one control stage transistor per column for "m" controlled stage transistors, the various columns being formed on different conductor tracks of the first type interconnected in accordance with the above-defined layout and being separated alternately by the conductor tracks of the second type and of the third type, which tracks are interconnected in accordance with the above-defined layout.

2. A circuit according to claim 1, wherein the conductor wires connecting the connection tabs of the semiconductor chips to a conductor track of the same type are identical in length and as short as possible.

3. A circuit according to claim 1, wherein said conductor tracks are interconnected by other conductor tracks disposed transversely thereto.

4. A circuit according to claim 3, wherein said conductor tracks disposed transversely are disposed on either side of the pattern constituted by the conductor tracks on which the columns of semiconductor chips are disposed and the intervening columns of conductor tracks.

* * * * *